United States Patent
Lee

(10) Patent No.: US 6,549,036 B1
(45) Date of Patent: Apr. 15, 2003

(54) SIMPLE OUTPUT BUFFER DRIVE STRENGTH CALIBRATION

(75) Inventor: Terry R. Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 323 days.

(21) Appl. No.: 09/583,884

(22) Filed: May 31, 2000

(51) Int. Cl.$^7$ .......................................... H03K 19/0175
(52) U.S. Cl. .......................................... 326/83; 326/27
(58) Field of Search .............................. 326/21, 26, 27, 326/30, 83, 82, 86

(56) References Cited

U.S. PATENT DOCUMENTS

| | | |
|---|---|---|
| 4,683,383 A | 7/1987 | Wang |
| 4,719,369 A | 1/1988 | Asano et al. |
| 4,890,016 A | 12/1989 | Tanaka et al. |
| 4,988,888 A | 1/1991 | Hirose et al. |
| 5,285,116 A * | 2/1994 | Thaik .......................... 326/21 |
| 5,391,939 A | 2/1995 | Nonaka |
| 5,444,397 A | 8/1995 | Wong et al. |
| 5,457,407 A | 10/1995 | Shu et al. |
| 5,585,742 A | 12/1996 | Kamiya |
| 5,717,343 A | 2/1998 | Kwong |
| 5,764,103 A | 6/1998 | Burra et al. |
| 5,789,974 A | 8/1998 | Ferguson, Jr. et al. |
| 5,850,159 A | 12/1998 | Chow et al. |
| 5,864,506 A | 1/1999 | Arcoleo et al. |
| 5,931,953 A | 8/1999 | Lesmeister |
| 5,935,258 A | 8/1999 | Lesmeister |
| 6,333,639 B1 * | 12/2001 | Lee .............................. 326/30 |
| 6,356,106 B1 * | 3/2002 | Greeff et al. ................. 326/30 |

* cited by examiner

*Primary Examiner*—Don Le
(74) *Attorney, Agent, or Firm*—Dickstein, Shapiro, Morin & Oshinsky LLP

(57) ABSTRACT

An output buffer driver calibration circuit and method are disclosed. Pull-up and pull-down devices of the output buffer driver circuit are simultaneously driven and the resulting output voltage is compared to a predetermined reference voltage, and a control signal is generated which is used to adjust the strength of one of the pull-up and pull-down devices so that the drive strength of the two devices approaches equality.

88 Claims, 7 Drawing Sheets

SIMPLE OUTPUT BUFFER DRIVE STRENGTH CALIBRATION

FIELD OF THE INVENTION

The present invention relates to an output buffer driver calibration circuit and calibration method for reducing timing uncertainty in high speed signaling systems.

BACKGROUND OF THE INVENTION

High-speed signaling systems use an output buffer driver calibration scheme to reduce timing uncertainty. The need for a calibration scheme is particularly important in bussed systems, where there are several different output buffer drivers that may drive the bus, or where there are several different output buffer drivers that drive a portion of a wide bus. Calibrated output buffer drivers reduce the timing uncertainty by matching the driver output from one output buffer driver to another, by matching the characteristics of a pull-up transistor (e.g., a transistor that drives a high voltage) to the characteristics of a pull-down transistor (e.g., a transistor that drives a low voltage), by setting an effective output impedance that helps to back-terminate transmission line reflections in the bus system, and by limiting the output voltage slew rates to improve transmittal signal integrity. Some of the benefits obtained by calibrated output buffer drivers can be achieved by closing specifying the driver characteristics for all transistors in an output buffer driver and all output buffer drivers in a system. Techniques such as specifying minimum and maximum output currents, specifying the current versus voltage curves with minimum and maximum limits, and by providing limits on the minimum and maximum slew rates have been used. However, an active calibration scheme can reduce the timing uncertainty further by adjusting out the effects of process variance, voltage variation or temperature variation on output buffer drivers.

In high-speed systems that use parallel bus termination, such as Rambus or SLDRAM, output buffer driver calibration has been implemented by comparing the voltage at the buffer driver output while it is driving high or low, and while the bus is connected through a parallel resistor, to another voltage. The other voltage is often termed VTT, and the VTT voltage level is set by system considerations. The resistor connection to VTT establishes the load current for normal operation, and for the calibration circuit.

In high-speed systems which do not use any form of parallel termination, the proper output buffer driving characteristics are even more critical for reducing timing uncertainty. In these systems, there is no parallel resistor on the bus to terminate the reflections, so the signal integrity relies on the output buffer driver ON impedance to back terminate any reflections in the system. Also, the output buffer driver slew rate can be quite sensitive to the driver characteristics, when there is no DC load provided by a termination resistor.

A calibration scheme has been proposed for non-terminated systems that uses a pull-up transistor in an ON state of one output buffer driver as the load to the pull-down transistor of a different output buffer driver, and vice versa. However, this will not guarantee that the VOH (logic output high voltage) will be symmetric about a mid-voltage (often called VREF) to VOL (logic output low voltage). Rather, this scheme will match the ON resistance of output buffer driver A pull-down transistor to the ON resistance of output buffer driver B pull-up transistor. Likewise the ON resistance of output buffer driver A's pull-up transistor will be calibrated to the ON resistance of output buffer driver B's pull-down transistor. If the drive strength of driver B pull-up transistor is mismatched to its pull-down transistor, then this relationship will be replicated in driver A after calibration. A mismatch of the pull-up transistor characteristic with the pull-down transistor characteristic will create a different timing relationship with signals transitioning to a logic one state versus signals transitioning to a logic zero state. This results in a timing uncertainty in the system, which will limit the maximum system operational data rate.

A further limitation of the above approach, is that there are often situations where it is desirable for an output buffer driver at one end of the bus to have a different drive strength than an output buffer driver at the other end of the bus, due to differences in the bus topology that each driver drives. An example of this situation is with a memory controller that drives multiple DRAMs from one end of the bus, and the DRAM which may actually be at an intermediate portion of the bus, as opposed to one end of the bus. With the above calibration scheme, it would not be possible to retain different drive strengths for different output buffer drivers. A final disadvantage of this approach is that there can be risk of device latch-up when two separate drivers drive a bus simultaneously. A driver that has SCR latch up will not allow calibration to occur, and it is usually necessary to remove and re-apply the power supply voltage to exit the latch up condition.

SUMMARY OF THE INVENTION

The present invention provides a simple output driver calibration circuit and calibration method which reduces timing uncertainty in high speed signaling systems. The invention may be applied to both terminated and non-terminated bus systems. The calibration circuit and associated calibration method simultaneously turns on the pull-up and pull-down transistor in an output buffer driver under calibration. The resulting output voltage is compared to a reference voltage that is set for the appropriate ratio of pull-up to pull-down drive strength. If the output voltage is above or below the reference voltage, the drive strength of the pull-up or pull-down transistor of the driver under calibration can be increased or decreased, by command in one or more steps, to equalize the output voltage to the desired reference voltage setting.

BRIEF DESCRIPTION OF THE DRAWINGS

These and other advantages and features of the invention will become more apparent from the following detailed description of the invention which is provided in connection with the accompanying drawings in which.

DETAILED DESCRIPTION OF THE INVENTION

The present invention provides an output buffer driver calibration circuit and associated method which does not require the use of two separate drivers driving a bus line simultaneously during the calibration operation. In addition, the invention ensures that the calibration scheme adjusts the VOH and VOL levels to be symmetric about a midpoint voltage, VREF, and avoids the use of additional extra signal pins to an output buffer driver circuit for purposes of calibration.

Figure 1:
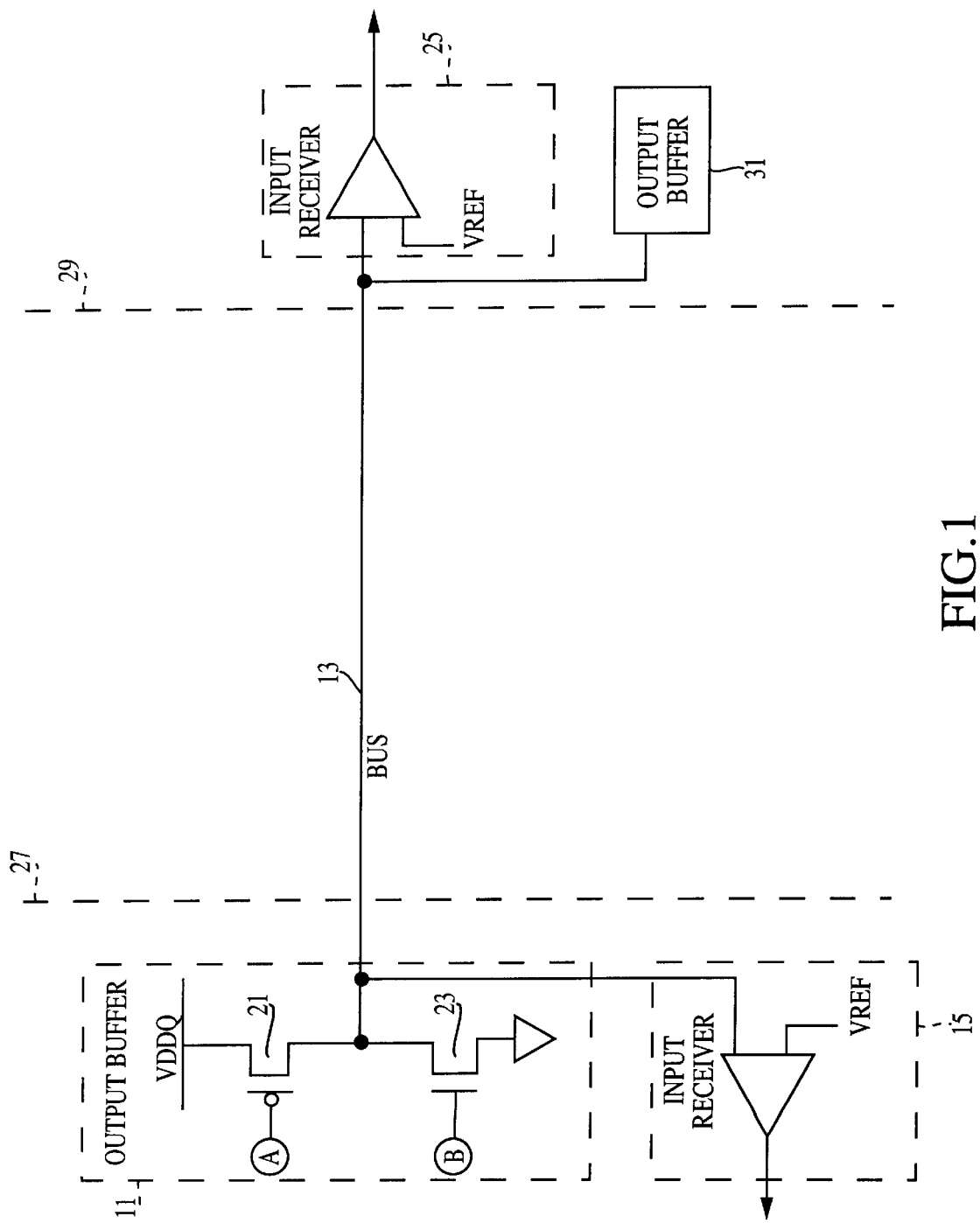
FIG. 1 illustrates a typical output buffer driver circuit which may employ the invention.

FIG. 1 shows a simplified schematic diagram of an output buffer driver 11 driving a bus system 13 which can utilize the calibration circuit and method of the invention. Logic signals generated on bus 13 by output buffer driver 11 at a first location on the bus (depicted by dotted line 27) are received by an input buffer receiver 25 provided at another location on the bus 13 (depicted by dotted line 29). An output buffer 31, similar in construction to output buffer 11, may also be provided at the receiving location 29 of the bus 13, while yet another input receiver 15 may be provided on the output location 27 of bus 13. The illustrated circuit is similar to a conventional I/O (input/output) bus circuit. Variations for this circuit include having bus location 27 arranged with an input only receiver 15 or an output only buffer driver 11. In this case, one of the output buffer driver 11 and input receiver 15 would be removed, leaving only one such device at location 27 of the bus. The same is true for bus location 29. All that is needed is that one of the bus locations 27 and 29 contains an output buffer 11, 31 and the other contains an input receiver 15, 25.

The output driver buffer 11 includes a transistor 21 which provides the current to pull the bus 13 voltage to a high level, and is referred to as a pull-up transistor. This transistor can be implemented as a P-channel device, an N-channel device, or a combination of the P-channel and N-channel devices. Transistor 23 provides the current to pull the bus 13 voltage to a low level, and is referred to as a pull-down transistor. Again, this transistor may be implemented as a P-channel device, N-channel device or a combination of the two. The input receiver 15, 25 is a conventional input receiver suitable for receiving high-speed data logic signals. This is typically implemented as a common source differential amplifier with a voltage reference VREF as one of the inputs and the bus voltage has the other of the inputs.

During normal operation, the gate of transistor 1 at node A is asserted low while the gate of transistor 23 at node B is asserted low to switch the bus voltage to a high voltage or logic "1" level. Nodes A and B are essentially transitioned simultaneously for the fastest switching transition. Likewise, node A is asserted high, while node B is asserted high for a logic "0" state. During calibration of the output buffer driver 11, node A is asserted low while node B is asserted high, so both transistors 21 and 23 are turned on at the same time. If the output buffer driver 11 currents are well matched in this condition, the output voltage on the system bus will be at VDDQ/2, or VREF. A comparison of the bus voltage to VREF can be performed at the input receiver 25 at a receiving location 29. Alternatively, in the case of bidirectional bus signaling (having input/output buffers), an input signal receiver 15 at on the driving location 27, can be used to make this comparison. During calibration, the output of the input receiver 25, or input receiver 15, will be at a logic "1" if the transistor 21 has a greater drive strength than transistor 23, or at a logic "0" state if transistor 23 has a greater drive strength than transistor 21. During calibration, the differential voltage between the system bus 13 and VREF will be quite small, so some delay will be required when sampling the output of the input receiver (15 or 25) after the output buffer driver 11 drives the bus 13 with both transistors 21 and 23 turned on.

During the calibration mode, , the input receiver 25 (or receiver 15) output is sampled after the delay time to determine which transistor 21, 23 has the greater drive strength. The transistor with the greatest drive strength can be reduced in strength by reducing its effective device width. Various techniques are available for effectively adjusting drive strength of pull-up and pull-down transistors of an output buffer driver. For example, U.S. Pat. No. 5,864,506 describes one such technique in which a plurality of drive transistors are provided in parallel at each of the locations corresponding to transistors 21 and 23 of output buffer driver 11. Drive strength is adjusted by enabling/disabling one or more of the parallel transistors. Thus, for example, to decrease drive strength, one or more of the parallel transistors are disabled. Another common method to adjust drive strength of transistors 21 and 23 is to use a plurality of gate fingers for each transistor. With this technique drive strength can be adjusted (in our example decreased) by reducing the number of gate fingers activated by pre-driver circuit. Other techniques for altering the transistor drive strength may also be used. Likewise the drive strength of the weak of the weak transistor may be increased to match the strength of the stronger transistor by adding device width to the weak transistor using the same drive strength adjustment techniques.

Figure 2:
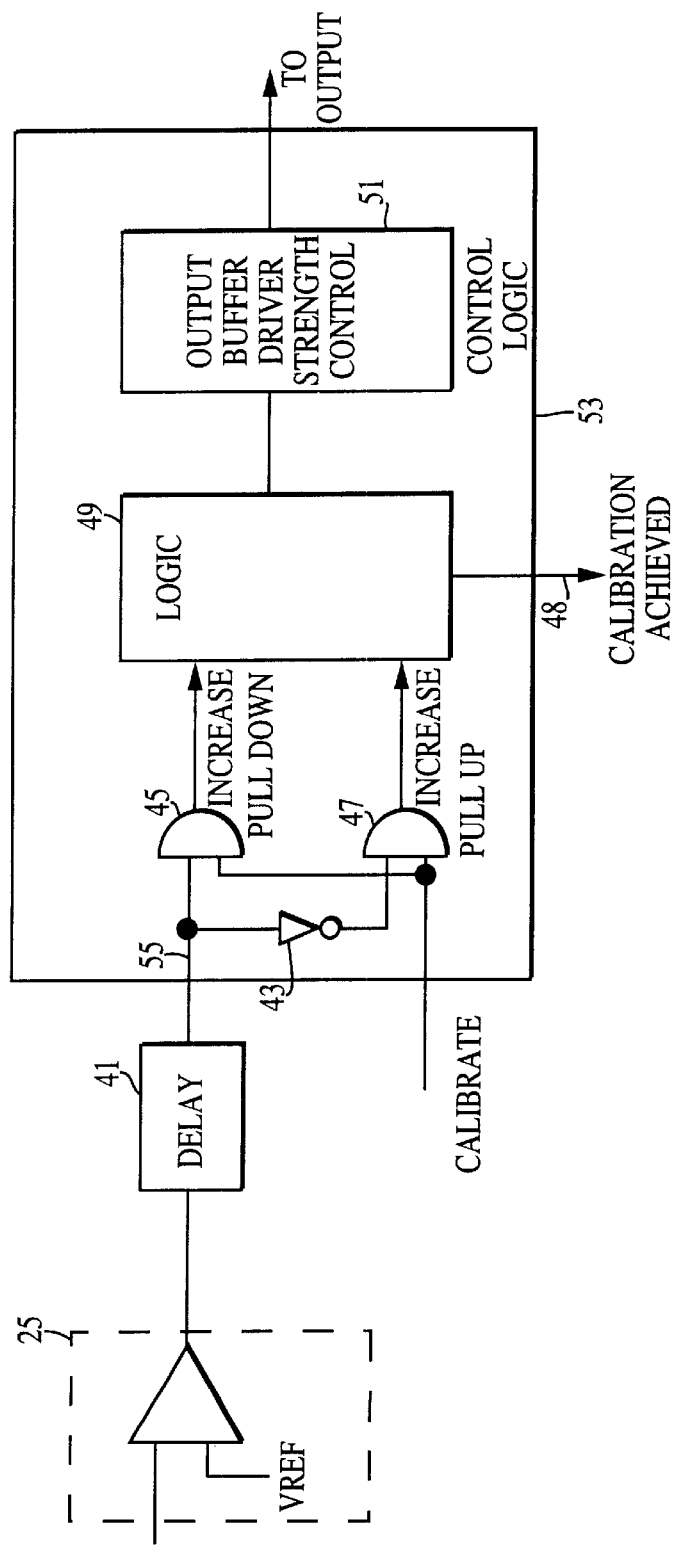
FIG. 2 illustrates calibration control circuitry in accordance with an embodiment of the invention.

The calibration logic circuit 53 is illustrated in FIG. 2. It has the responsibility of sampling the output of the input receiver 15 or 25, and adjusting the drive strength of the output buffer driver 11 by command.

As shown in FIG. 2, the calibration control logic 53 includes an AND gate circuit including AND gates 45, 47 and an inverter 43, logic circuit 49, and an output strength adjustment control circuit 51. A CALIBRATE signal is asserted when a calibration mode is begun. This enables gates 45 and 47. The output of the receiver 25 (or receiver 15) is used to establish the relative drive strengths of the pull-up and pull-down transistors 21, 23. In this example, we assume we will be increasing the drive strength of the weaker transistor.

As a result of the comparison of the bus 13 output voltage to VREF by receiver 25 (or receiver 15), either a "1" or "0" logic state is detected depending on whether the bus voltage is higher or lower than VREF. If a "1" is present on line 55, indicating that the pull-up transistor is stronger than pull-down transistor 23, AND date 45 applies a signal to logic circuit 49 instructing an increase in strength of a pull-down transistor 23 if a "0" is present and gate 47 applies a signal to logic circuit 49 instructing an increase in the strength of pull-up transistor 21. The calibration is performed after the output voltage as sensed by the receiver 25 (or 15) is delayed by an appropriate amount in delay circuit 41 to ensure a precise measurement. After the comparison is completed, the logic circuit 49 sends an appropriate strength adjustment command to output strength control circuit 51 which adjusts the output driver strength.

Since the output of the receiver 25 (or 15) only indicates whether the output voltage on the bus 13 is above or below VREF, the initial driver strength adjustment may not be sufficient to adequately calibrate the output buffer driver 11. Consequently, after an appropriate delay, the calibration process can be repeated using the newly set driver strength.

This can be repeated several times with each newly set driver strength until the input receiver 25 (or 15) switches to the opposite logic state, indicating that the relative drive strength of the pull-up and pull-down transistors has now reversed.

The best setting for matching the drive strength is at this point, at the previous adjustment setting, or in between the two adjustment settings. At this point, the relative drive strengths of the pull-up and pull-down transistors are matched within the accuracy of the calibration circuitry, and the calibration process is complete. After this, normal bus operations can begin. The logic circuit 49 will determine when calibration has been achieved within the accuracy of the calibration control logic 53 by noting the changed logic states of the output of a receiver (15 or 25) or a comparator 61, and at that point will stop changing output buffer drive strength and issue a command on line 48 indicating that calibration has been achieved.

Other processes for performing the calibration are also possible. For example, a binary search algorithm can be used to seek the best output buffer driver setting by first using coarse driver strength adjustments by logic 49 until the input receiver 25 (or 15) changes state and thereafter having logic 49 make finer adjustments in the opposite direction until receiver 25 (or 15) changes state again. This back and forth adjustment using finer strength adjustment stages can continue until a predetermined end point is reached.

Figure 3:
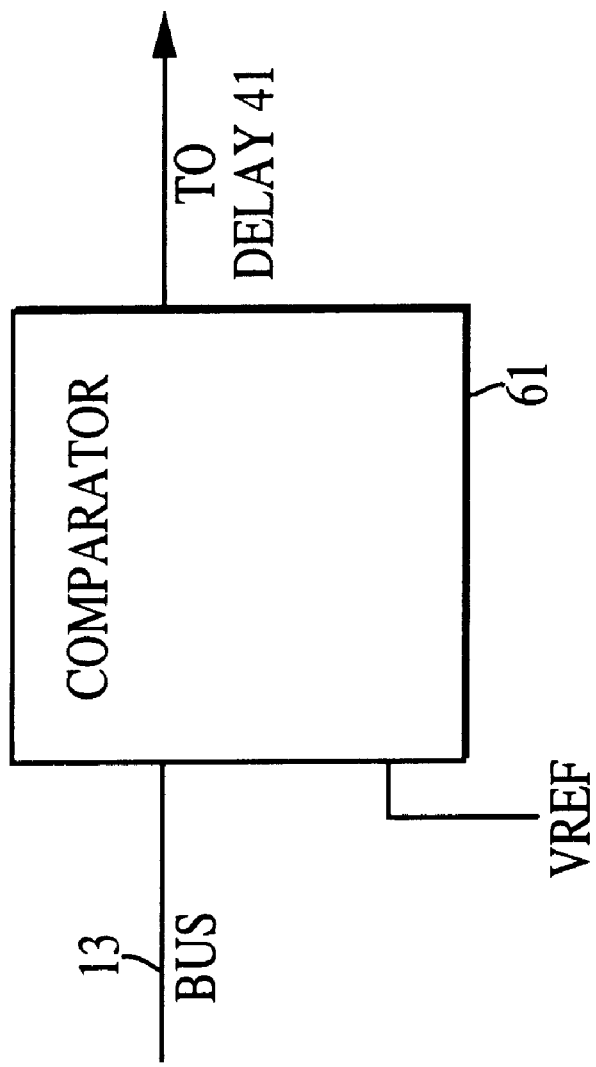
FIG. 3 illustrates a separate comparator which may be used in a modified embodiment of the invention.

To improve the resolution accuracy and accuracy of the calibration process, a higher accuracy comparator 61 can be used for the calibration circuit in place of receiver 25 (or 15), as shown in FIG. 3. Since calibration can be a slow operation, a slower, but more accurate, comparator 61 may be preferred. It may also be desirable to set the drive strength to be different from the pull-up and pull-down transistor. In this case, a voltage reference other than VDDQ/2 may be used and the system reference VREF may not be used if it is nominally set to VDDQ/2.

Figure 4:
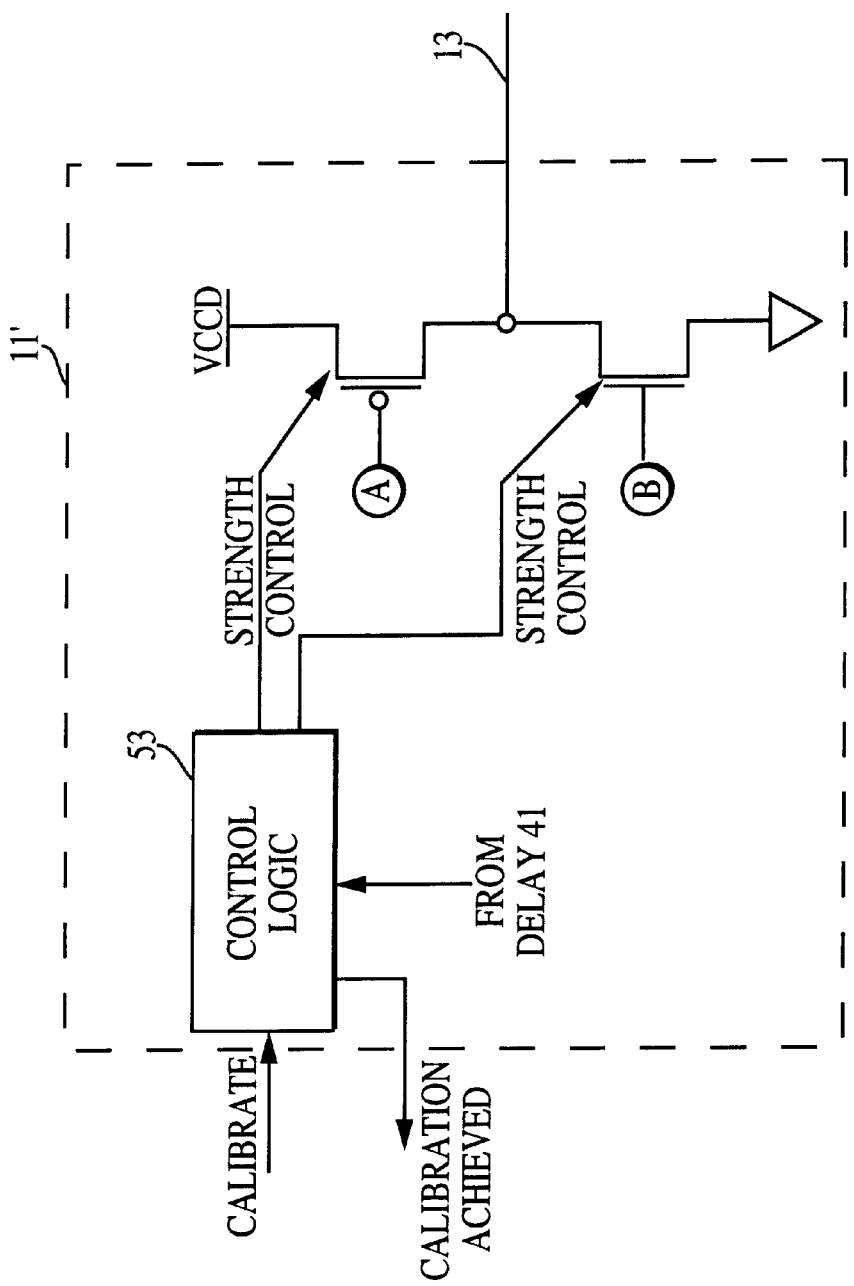
FIG. 4 illustrates use of the calibration control circuitry on the driver side of a bus in accordance with another modified embodiment of the invention.
Figure 5:
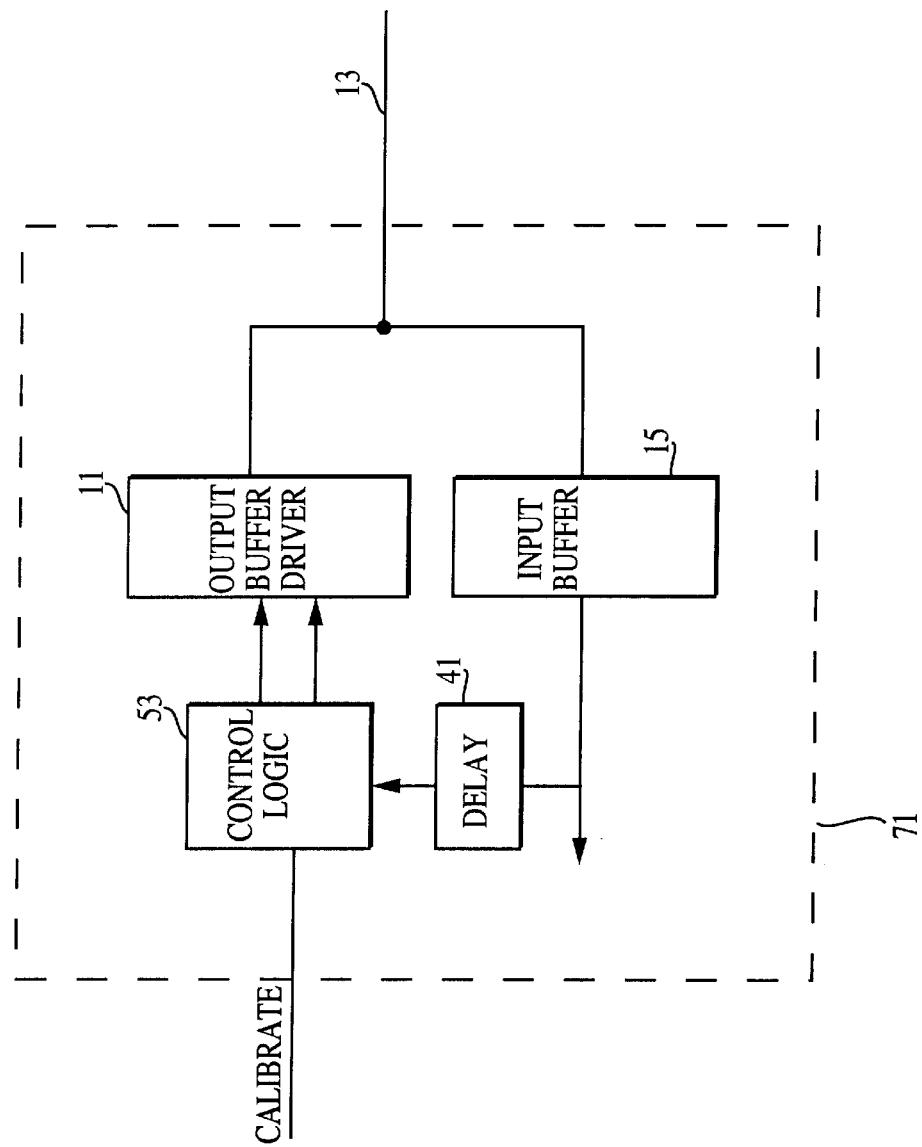
FIG. 5 illustrates use of the calibration control circuit on the driver side of the bus in accordance with yet another modified embodiment of the invention.

As noted, the calibration comparison circuitry, whether incorporated as a bus receiver or separate comparator 61, may be on either the driving location 27 of the bus at a normal receiver location 29 of the bus. When the comparator is provided on the driver side 27 of the bus, the control logic 53 may be internal to the output buffer 11 itself, as shown in FIG. 4 or to an input/output buffer 71 which includes output buffer driver 11 and an input receiver 15, as schematically shown in FIG. 5.

When the comparator is provided at the output buffer driver location 27, the output buffer driver 11 may be commanded, externally or self-commanded, to enter the calibration mode by the presence of the CALIBRATE signal, and the calibration process will proceed until calibration is achieved. The calibration control logic 53 will perform the steps necessary to achieve calibration. If the calibration control circuitry is located at bus location 29, it will be necessary to provide commands to to the output buffer driver 11 causing it to increase or decrease the pull-up or pull-down transistor driver strength. This can be accomplished using known techniques for inputting commands to a logic device such as a combination of command or other input signals, or by writing a command instruction to an internal register on the output buffer driver 11, such as a mode register, for the purpose of receiving and decoding the strength adjustment commands. The calibration mode can also be controlled by providing additional calibration mode pins on the circuitry containing the output buffer driver 11 to receive strength adjustment commands.

In an alternative embodiment, the drive strength of either the pull-up or pull-down transistor may first be set to a fixed value and then calibration may be performed on the other transistor. In this case, the absolute value of one drive strength is first established and the above-described calibration process and circuitry may be used to set the drive strength of the opposite transistor. This approach will guarantee that the drive strengths are proper, and it would also allow for a different balance drive strength for different devices, if desirable.

Figure 6:
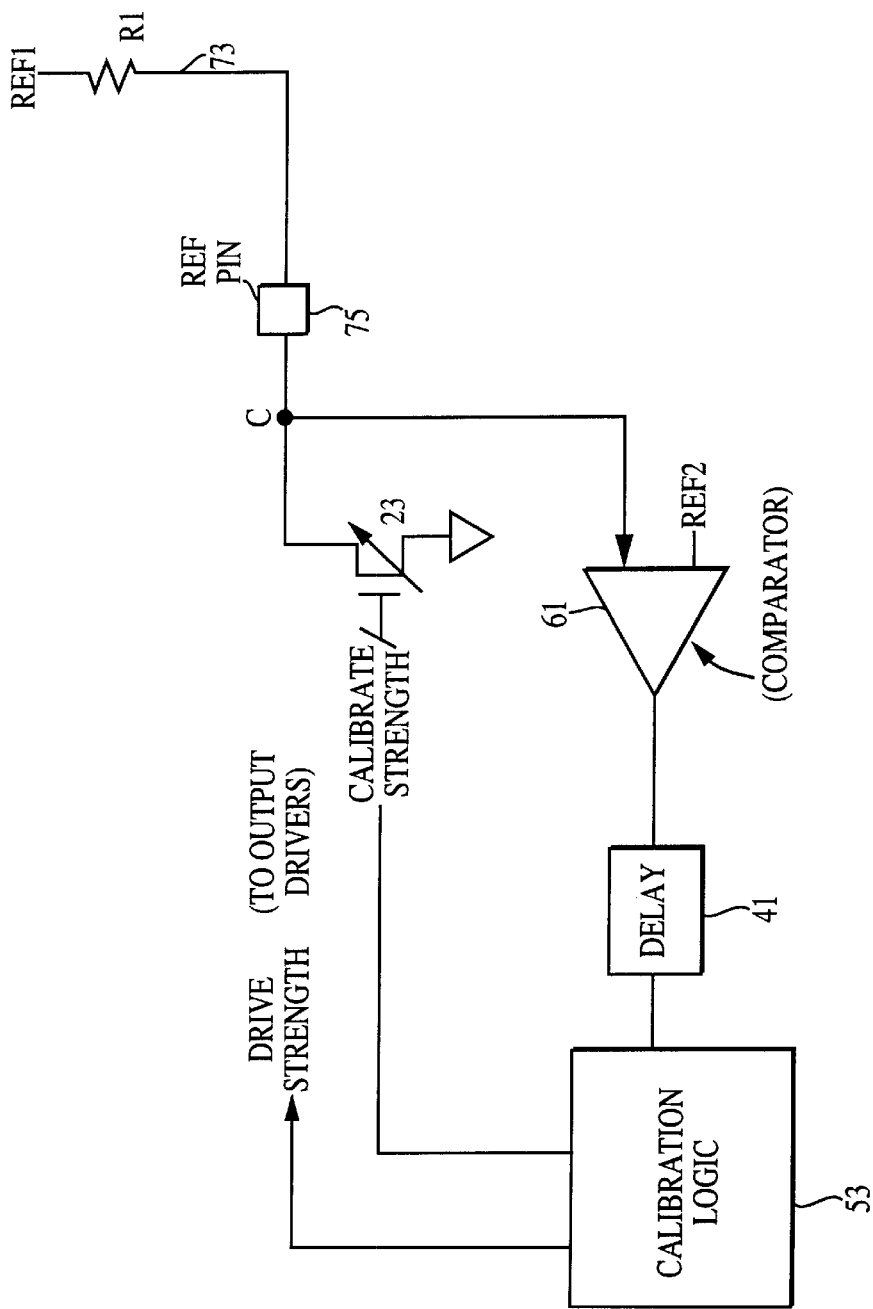
FIG. 6 illustrates a driver strength adjustment circuitry in accordance with another embodiment of the invention.

One method for setting the absolute drive strength, as illustrated in FIG. 6, is to provide an external resistor 73 connected between an external voltage REF1 and a reference pin 75 on the output buffer driver device. Reference pin 75 may be multiplexed, if desired, to connect a pull-up or pull-down transistor 21, 23 to the resistor 73 to be used as a load. FIG. 6 shows the reference transistor as the pull-down transistor 23 which will be set to a predetermined value as part of an output buffer driver circuit 11. However, it is also possible to use a separate reference drive circuit containing a transistor which is separate and apart from the normal output buffer driver 11, to set a reference strength for one of the pull-up and pull-down transistors of the output buffer driver 11.

Assuming one of the output buffer drivers 11 which will be used to drive bus 13 is used to set a reference strength, the reference strength is set for one of the pull-up and pull-down transistors (the pull-down transistor 23 being shown in FIG. 6) to a particular value by comparator 61, delay 41 and calibration logic 53, and then the calibration of the output buffer driver 11 can be carried out in the manner described above with reference to FIGS. 2–5. The reference transistor strength can be set individually for each of the output buffer drivers 11 using the FIG. 6 circuit, or one of the output buffer drivers 11 can be used as the reference to set the reference strength for all output buffer drivers 11 which may be used in a bus driving scheme.

If a separate reference driver is employed in FIG. 6 for a pull-up or pull-down transistor, then once its strength is determined, a similar adjustment value can be applied to the pull-up or pull-down, as appropriate, transistors of the actual output buffer drivers 11. This strength adjustment value for the output buffer drivers may be the same as the driver adjustment or it may be scaled.

During the calibration mode for the FIG. 6 circuit, a number of parallel transistor devices or gate fingers of a transistor are turned on to provide a drive current capability to the referenced transistor, shown as transistor 23 in FIG. 6. In the example shown in FIG. 6, where the pull-down transistor drive strength is adjusted, the voltage of the reference pin 75, node C is compared to a second reference voltage REF2 in comparator 61 (or in an input receiver 15). After an appropriate delay, as set by the delay circuit 41, the calibration logic notes the comparison result and changes the drive strength of the reference transistor, e.g., 23, in an attempt to match the reference pin voltage at node C to REF2. The values of REF1, R1 and REF2 can be chosen according to system requirements. When the process for setting the strength of transistor 23 to a desired value is completed, the drive strength value for the other transistors, e.g., 21, can then be calibrated in the manner described above with reference to FIGS. 2–5.

As noted, in lieu of directly adjusting a particular pull-up or pull-down transistor of an operative buffer driver 11 to a particular strength, the FIG. 6 circuit can adjust the strength of a transistor of a reference driver to a particular strength and then use that to set the strength of like transistors (pull-up or pull-down) of all output buffer drivers, following which all output buffer drivers are calibrated in the manner described above with reference to FIGS. 25.

Depending on the relative device sizes of the reference driver (when used) and the output buffers, and the values chosen for REF1, R1, and REF2, the driver setting for the output buffer drivers may be the same or different from those for the reference driver. If a pull-up or pull-down transistor of any output driver 11 is used as the reference transistor, the connection to resistor 73 can be multiplexed during a calibration mode to set the driver strength of one of the pull-up and pull-down transistors of each output buffer driver 11.

As noted, it is also possible to use the invention to calibrate a single output buffer driver on a device containing plural output buffer drivers and then set the other drivers to the same adjusted values, or to adjust each buffer output driver individually. While the latter approach is more complex, the calibration can account for differences between individual output buffer drivers of the plurality of drivers.

Although the calibration circuit and method of the invention have been described and illustrated with reference to a comparison of bus voltage in a reference voltage VREF, calibration may also be obtained by comparing the drive current on the bus 13 with a reference drive current. In addition, although a reference circuit used in FIG. 6 relies on producing a voltage reference from an external circuit, it is also possible to provide a reference current from an external circuit which is compared to the drive current of the transistor whose strength is to be adjusted, e.g., transistor 23 in FIG. 6.

Figure 7:
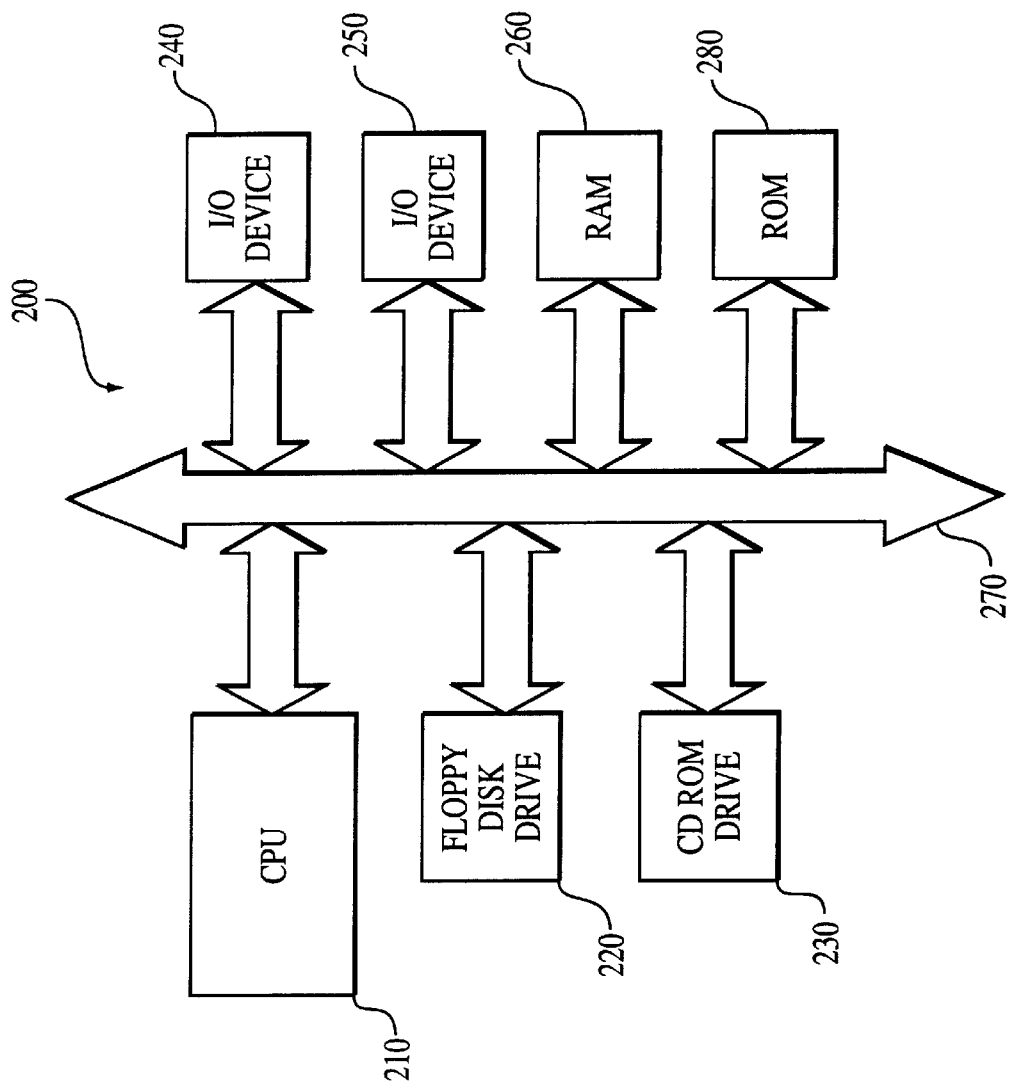
FIG. 7 illustrates a processor based system constructed in accordance with the invention.

The present invention will find utility in any device which uses output buffer devices to apply signals to a transmission path, such as a bus. For example, the invention may be employed in any processor based system, such as the one illustrated as 200 in FIG. 7.

A computer system is exemplary of a system having integrated circuits, such as for example memory circuits or a processor circuit which may utilize the invention. Most conventional computers include memory devices permitting storage of significant amounts of data. The data is accessed using a bus system during operation of the computers. Other types of dedicated processing systems, e.g., radio systems, television systems, GPS receiver systems, telephones and telephone systems also contain memory and processor devices which can utilize the present invention.

A processor based system, such as a computer system, for example, generally comprises a central processing unit (CPU) 210, for example, a microprocessor, that communicates with one or more input/output (I/O) devices 240, 250 over a bus 270. The computer system 200 also includes random access memory (RAM) 260, a read only memory (ROM) 280 and, in the case of a computer system may include peripheral devices such as a floppy disk drive 220 and a compact disk (CD) ROM drive 230 which also communicate with CPU 210 over the bus 270. At least one of CPU 210 and one or more integrated circuits connected thereto, such as employed for RAM 260 and ROM 280, are preferably constructed as integrated circuits which include a calibration circuit for calibrating the characteristics of output buffer drivers as previously shown and described with respect to FIGS. 2–6. It may also be desirable to integrate the processor 210 and memory 260 on a single IC chip and have one or both of processor 210 and memory 260 employ the calibration circuit shown and described with reference to FIGS. 2–6.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A method of calibrating a driver circuit having pull-up and pull-down devices, said method comprising:
    simultaneously driving said pull-up and pull-down devices to provide an output voltage;
    comparing said output voltage with a reference voltage and providing a control signal representing the result of said comparison; and
    using first control signal to adjust the driving strength of at least one of said pull-up and pull-down devices of said driver circuit.

2. A method as in claim 1, wherein said control signal is used to adjust the strength of at least one of said pull-up and pull-down devices such that said output voltage approaches a predetermined voltage relationship with respect to said reference voltage.

3. A method as in claim 1, wherein said driver circuit is coupled to a bus.

4. A method as in claim 3, wherein said comparison is performed by comparing said output voltage on said bus with said reference voltage.

5. A method as in claim 4, wherein said bus is coupled to a bus receiver circuit and said receiver circuit performs said comparison of said output voltage with said reference voltage.

6. A method as in claim 5, wherein said receiver circuit is connected to said bus at a position remote from said driver circuit.

7. A method as in claim 5, wherein said receiver circuit is connected to said bus at a position where said driver is located.

8. A method as in claim 3, wherein said first comparison is performed by a comparison circuit, which is separate from a bus signal receiver circuit.

9. A method as in claim 8, wherein said comparison circuit is connected to said bus at a position remote from said driver circuit.

10. A method as in claim 8, wherein said comparison circuit is connected to said bus at a position where said driver is located.

11. A method as in claim 10, wherein said comparison circuit is part of said driver circuit.

12. A method as in claim 5, wherein a control signal output of said receiver is sampled.

13. A method as in claim 8, wherein a control signal output of said comparator is sampled.

14. A method as in claim 12 or 13, wherein said sampling is performed at a time delayed from the time when said pull-up and pull-down devices are first simultaneously driven.

15. A method as in claim 1, wherein each of said pull-up and pull-down devices is formed by at least one transistor.

16. A method as in claim 15, wherein the drive strength of said circuit driver is adjusted by adjusting the effective device width of at least one of said pull-up and pull-down devices.

17. A method as in claim 1, wherein said comparison identifies which of said pull-up and pull-down devices needs to have its drive strength adjusted by determining whether said output voltage is above or below said reference voltage, said control signal having a logic level which represents which of said pull-up and pull-down devices needs drive strength adjustment.

18. A method as in claim 1, wherein said comparison identifies which of said pull-up and pull-down devices has a greater drive strength and said control signal is used to reduce the drive strength of the pull-up or pull-down device which has the greater drive strength.

19. A method as in claim 18, wherein said pull-up and pull-down devices are each formed by at least one transistor and the drive strength of the pull-up or pull-down transistor having the greater drive strength is reduced by reducing its effective device width.

20. A method as in claim 19, wherein each of said pull-up and pull-down transistors has a plurality of gate fingers and the effective device width of the transistor with the greater drive strength is reduced by reducing the number of its gate fingers which are active.

21. A method as in claim 18, wherein said pull-up and pull-down devices are each formed of a plurality of transistors connected in parallel and the drive strength of the pull-up or pull-down device having the greater drive strength is reduced by disabling one or more of its parallel connected transistors.

22. A method as in claim 1, wherein said first comparison identifies which of said pull-up and pull-down devices has a weaker drive strength and said control signal is used to increase the drive strength of the pull-up pull-down device which has the weaker drive strength.

23. A method as in claim 22, wherein said pull-up and pull-down devices are transistors and the drive strength of the pull-up or pull-down transistor having the weaker drive strength is increased by increasing its effective device width.

24. A method as in claim 23, wherein each of said pull-up and pull-down transistors has a plurality of gate fingers and the effective device width of the transistor with the weaker drive strength is increased by increasing the number of its gate fingers which are active.

25. A method as in claim 22, wherein said pull-up and pull-down devices are each formed of a plurality of transistors connected in parallel and the drive strength of the pull-up or pull-down device having the weaker drive strength is increased by enabling one or more of its parallel connected transistors.

26. A method as in claim 17, wherein said acts of driving said driver circuit, performing said comparison and using said control signal to adjust said driving strength are repeated until the logic level of said control signal changes state.

27. A method as in claim 26, wherein a final drive strength adjustment is that which occurred just prior to the logic level of said control signal changing state.

28. A method as in claim 26, wherein a final drive strength adjustment is that adjustment which first occurs after the logic level of said control signal changes state.

29. A method as in claim 26, wherein a final drive strength adjustment is determined and set as a point between the drive strength adjustment which occurred just prior to the logic level of said control signal changing state and an adjustment indicated by said control signal just after said logic level changes state.

30. A method as in claim 26, wherein each adjustment of driving strength performed using said control signal is done in a first coarse adjustment increment.

31. A method as in claim 30, wherein after the logic level of said control signal changes state, said acts of driving said driver circuit, performing said comparison and using said control signal to adjust said driving strength are repeated, with said driving strength being adjusted each time in a second fine adjustment increment, until said control signal changes state again.

32. A method as in claim 1, wherein said driving circuit has said pull-up device coupled to a first voltage potential V1 and said pull-down device coupled to a second voltage potential V2, and said reference voltage is established at a voltage in between V1 and V2.

33. A method as in claim 32, wherein V1 is a positive voltage potential and V2 is ground.

34. A method as in claim 33, wherein said reference voltage is established as a voltage of substantially V1/2.

35. A method as in claim 33, wherein reference voltage is established as a voltage other than substantially V1/2.

36. A method as in claim 1, further comprising the steps of presetting a predetermined drive strength for one of said pull-up and pull-down devices before performing the acts of driving said driver circuit, performing said comparison and using said control signal to adjust the strength of the drive circuit, said control signal being used to adjust the strength of the other of said pull-up and pull-down devices.

37. The method of claim 36, wherein said presetting of said predetermined drive strength presets a stronger drive strength for said one of said pull-up and pull-down devices, and said control signal is used to adjust the drive strength of the other of the pull-up and pull-down devices which has a weaker drive strength.

38. The method of claim 36, wherein said presetting of said predetermined drive strength presets a weaker drive strength for said one of said pull-up and pull-down devices, and said control signal is used to adjust the drive strength of the other of the pull-up and pull-down devices which has a greater drive strength.

39. An apparatus for calibrating a driver circuit having pull-up and pull-down devices, said apparatus comprising:
a circuit for comparing an output voltage, produced by said driver circuit when said pull-up and pull-down devices are simultaneously driven, with a reference voltage, and providing a first control signal representing the result of the comparison; and
a circuit, responsive to said control signal, for adjusting the drive strength of at least one of said pull-up and pull-down devices.

40. An apparatus as in claim 39, wherein said adjusting circuit adjusts the strength of at least one of said pull-up and pull-down devices such that said output voltage approaches a predetermined voltage relationship with respect to said reference voltage.

41. An apparatus as in claim 1, wherein said driver circuit is coupled to a bus.

42. An apparatus as in claim 41, wherein said comparing circuit compares said output voltage on said bus with said reference voltage.

43. An apparatus as in claim 42, wherein said comparing circuit is a bus signal receiver circuit.

44. An apparatus as in claim 43, wherein said receiver circuit is connected to said bus at a position remote from said driver circuit.

45. An apparatus as in claim 43, wherein said receiver circuit is connected to said bus at a position where said driver circuit is located.

46. An apparatus as in claim 42, wherein said comparing circuit is a comparator circuit separate from a bus signal receiver circuit.

47. An apparatus as in claim 46, wherein said comparator circuit is connected to said bus at a position remote from said driver circuit .

48. An apparatus as in claim 46, wherein said comparator circuit is connected to said bus at a position where said driver is located.

49. An apparatus as in claim 48, wherein said comparator circuit is part of said driver circuit.

50. An apparatus as in claim 43, wherein said adjusting circuit samples a control signal output of said receiver circuit.

51. An apparatus as in claim 46, wherein said adjusting circuit samples a control signal output of said comparator circuit.

52. An apparatus as in claims 50 or 51, wherein said sampling is performed at a time delayed from the time when said pull-up and pull-down devices are first simultaneously driven.

53. An apparatus as in claim 39, wherein each of said pull-up and pull-down devices is formed by at least one transistor.

54. An apparatus as in claim 53, wherein said adjusting circuit adjusts the drive strength of said driver circuit by adjusting the effective device width of at least one of said pull-up and pull-down devices.

55. An apparatus as in claim 39, wherein said comparing circuit identifies which of said pull-up and pull-down devices needs to have its drive strength adjusted by determining whether said output voltage is above or below said reference voltage, said control signal having a logic level which represents which of said pull-up and pull-down devices needs drive strength adjustment.

56. An apparatus as in claim 39, wherein said comparison identifies which of said pull-up and pull-down devices has a greater drive strength and said control signal is used to reduce the drive strength of the pull-up or pull-down device which has the greater drive strength.

57. An apparatus as in claim 56, wherein said pull-up and pull-down devices are each formed by at least one transistor and the drive strength of the pull-up or pull-down transistor having the greater drive strength is reduced by reducing its effective device width.

58. An apparatus as in claim 57, wherein each of said pull-up and pull-down transistors has a plurality of gate fingers and the effective device width of the transistor with the greater drive strength is reduced by reducing the number of its gate fingers which are active.

59. An apparatus as in claim 56, wherein said pull-up and pull-down devices are each formed of a plurality of transistors connected in parallel and the drive strength of the pull-up or pull-down device having the greater drive strength is reduced by disabling one or more of its parallel connected transistors.

60. An apparatus as in claim 39, wherein said comparing circuit identifies which of said pull-up and pull-down devices has a weaker drive strength and said control signal is used to increase the drive strength of the pull-up pull-down device which has the weaker drive strength.

61. An apparatus as in claim 60, wherein said pull-up and pull-down devices are transistors and the drive strength of the pull-up or pull-down transistor having the weaker drive strength is increased by increasing its effective device width.

62. An apparatus as in claim 61, wherein each of said pull-up and pull-down transistors has a plurality of gate fingers and the effective device width of the transistor with the weaker drive strength is increased by increasing the number of its gate fingers which are active.

63. An apparatus as in claim 60, wherein said pull-up and pull-down devices are each formed of a plurality of transistors connected in parallel and the drive strength of the pull-up or pull-down device having the weaker drive strength is increased by enabling one or more of its parallel connected transistors.

64. An apparatus as in claim 55, wherein said comparing circuit and adjusting circuit are operated to repeatedly perform said comparison, provide said output signal and adjust said drive strength until the logic level of said control signal changes state.

65. An apparatus as in claim 64, wherein a final drive strength adjustment is that which occurred just prior to the logic level of said control signal changing state.

66. An apparatus as in claim 64, wherein a final drive strength adjustment is that adjustment which first occurs after the logic level of said control signal changes state.

67. An apparatus as in claim 64, wherein a final drive strength adjustment is determined and set as a point between the drive strength adjustment which occurred just prior to the logic level of said control signal changing state and an adjustment indicated by said control signal just after said logic level changes state.

68. An apparatus as in claim 64, wherein said adjusting circuit performs each adjustment of driving strength with a coarse adjusting increment.

69. An apparatus as in claim 68, wherein after the logic level of said control signal changes state, said comparing circuit and said adjusting circuit repeatedly perform said comparison and adjustment, with each said driving strength adjustment being in a fine increment, until the logic level of said control signal changes state again.

70. An apparatus as in claim 39, wherein said driving circuit has said pull-up device coupled to a first voltage potential V1 and said pull-down device coupled to a second voltage potential V2, and said reference voltage is established at a voltage in between V1 and V2.

71. An apparatus as in claim 70, wherein V1 is a positive voltage potential and V2 is ground.

72. An apparatus as in claim 71, wherein said reference voltage is established as a voltage of substantially V1/2.

73. An apparatus as in claim 71, wherein reference voltage is established as a voltage other than substantially V1/2.

74. An apparatus as in claim 39, further comprising a presetting circuit for presetting the strength of one of said pull-up and pull-down devices prior to operation of said comparison circuit and adjusting circuit, said comparison circuit and adjusting cooperating to adjust the strength of the other of said pull-up and pull-down devices.

75. An apparatus as in claim 74, wherein said presetting circuit presets a stronger drive strength for said one of said pull-up and pull -down devices, and said control signal is used to adjust the drive strength of the other of the pull-up and pull-down devices which has a weaker drive strength.

76. An apparatus as in claim 74, wherein said presetting circuit presets a weaker drive strength for said one of said pull-up and pull-down devices, and said control signal is used to adjust the drive strength of the other of the pull-up and pull-down devices which has a greater drive strength.

77. A processor based system comprising:

a processor; and at least one device for electrically communicating with said processor over a bus;

at least one of said processor and device including an output buffer driver circuit coupled to said bus for providing an output voltage to said bus; and a circuit for calibrating said output buffer driver circuit, said calibration circuit comprising:

a circuit for comparing an output voltage, produced by said driver circuit when said pull-up and pull-down devices are simultaneously driven, with a reference voltage, and providing a first control signal representing the result of the comparison; and a circuit, responsive to said control signal, for adjusting the drive strength of at least one of said pull-up and pull-down devices.

78. A system as in claim 77, wherein said adjusting circuit adjusts the strength of at least one of said pull-up and pull-down devices such that said output voltage approaches a predetermined voltage relationship with respect to said reference voltage.

79. A system as in claim 77, wherein said comparing circuit is a bus signal receiver circuit.

80. A system as in claim 79, wherein said receiver circuit is connected to said bus at a position remote from said driver circuit.

81. A system as in claim 79, wherein said receiver circuit is connected to said bus at a position where said driver circuit is located.

82. A system as in claim 77, wherein said comparing circuit is a comparator circuit separate from a bus signal receiver circuit.

83. A system as in claim 82, wherein said comparator circuit is connected to said bus at a position remote from said driver circuit.

84. A system as in claim 82, wherein said comparator circuit is connected to said bus at a position where said driver is located.

85. A system as in claim 84, wherein said comparator circuit is part of said driver circuit.

86. A system as in claim 79, wherein said adjusting circuit samples a control signal output of said receiver circuit.

87. A system as in claim 82, wherein said adjusting circuit samples a control signal output of said comparator circuit.

88. A system as in cl aim 86 and claim 87, wherein said sampling is performed at a time delayed from the time when said pull-up and pull-down devices are first simultaneously driven.

* * * * *

UNITED STATES PATENT AND TRADEMARK OFFICE
CERTIFICATE OF CORRECTION

PATENT NO.   : 6,549,036 B1
DATED        : April 15, 2003
INVENTOR(S)  : Terry R. Lee It is certified that error appears in the above-identified patent and that said Letters Patent is hereby corrected as shown below:

Title page,
Item [56], References Cited, U.S. PATENT DOCUMENTS, 16th U.S. Patent Document, change "5,935,258" to -- 5,935,256 --.

Column 7,
Line 4, change "FIGS. 25" to -- FIGS. 2-5 --.

Signed and Sealed this

Twenty-second Day of July, 2003

JAMES E. ROGAN
*Director of the United States Patent and Trademark Office*